United States Patent [19]

Brueggeman et al.

[11] Patent Number: 4,653,175
[45] Date of Patent: Mar. 31, 1987

[54] SEMICONDUCTOR STRUCTURE HAVING ALPHA PARTICLE RESISTANT FILM AND METHOD OF MAKING THE SAME

[75] Inventors: Michael Brueggeman, Mt. View; James W. Clark, San Jose; William S. Phy, Los Altos Hills, all of Calif.

[73] Assignee: Fairchild Semiconductor Corporation, Cupertino, Calif.

[21] Appl. No.: 836,038

[22] Filed: Mar. 4, 1986

Related U.S. Application Data

[62] Division of Ser. No. 578,408, Feb. 9, 1984, abandoned.

[51] Int. Cl.⁴ .......................................... H01L 21/312
[52] U.S. Cl. ............................................ 29/574; 29/583; 156/237; 156/239; 156/241; 427/5; 427/82
[58] Field of Search ................... 29/583, 574; 156/239, 156/237, 241; 427/5, 82

[56] References Cited

U.S. PATENT DOCUMENTS 3,738,888  6/1973  Williams .............................. 156/241
4,423,548  1/1984  Hulseweh ............................. 29/591
4,468,411  8/1984  Sloan .................................. 427/5
4,481,526  11/1984  Miyasaka .............................. 357/84

FOREIGN PATENT DOCUMENTS

J55128-851  6/1980  Japan .
2036428A    6/1980  United Kingdom .

OTHER PUBLICATIONS

"Polyimide Film—not Liquid—Shields RAMs . . . " Elec. Des. 11/22/80.

Primary Examiner—John D. Smith
Attorney, Agent, or Firm—Carl L. Silverman; David H. Carroll; James M. Heslin

[57] ABSTRACT

An applique of a prepatterned film of alpha particle resistant material, such as polyimide, is applied to a semiconductor wafer. The prepatterned film covers only the critical areas e.g. those affected by alpha particle impingement. Bond pads and scribe streets are not covered by the applique.

10 Claims, 7 Drawing Figures

SEMICONDUCTOR STRUCTURE HAVING ALPHA PARTICLE RESISTANT FILM AND METHOD OF MAKING THE SAME

This is a division of application Ser. No. 578,408 filed Feb. 9, 1984, now abandoned.

BACKGROUND OF THE INVENTION

The present invention relates generally to integrated circuit devices, and more particularly, to a method for making a semiconductor structure having an alpha particle resistant film and to such semiconductor structures.

In the manufacture of integrated circuits, semiconductor wafers containing many separate integrated circuits are fabricated and then cut into individual integrated circuits, often individually referred to as die. It is well known that the die may be adversely affected by alpha particles, such as those alpha particles which are emitted from metals, ceramics, as well as some plastic materials. When such alpha particles impinge on a semiconductor memory cell, a change may result in the state of a bit within the memory cell, resulting in a phenomenon known in the industry as a "soft bit error". Although this type of error may be corrected using known error correction and detection schemes, multiple "soft bit errors" may create conditions in which such schemes are unable to provide a desired correction. Thus, it is desirable to protect integrated circuit die which are subject to degradation by alpha particles.

The need to provide alpha particle protection has become more critical as the density of integrated circuits increases. Although there are available methods for providing some degree of alpha particle protection, none of these methods is totally satisfactory inasmuch as such methods present certain disadvantages and/or require cumbersome processing techniques. For example, one technique includes the application of liquid polyimide on the individual die after the die has been attached to a substrate and wire bonded. This technique requires substantial labor while providing a high die rejection rate. Further, this liquid system does not reliably provide a sufficient thickness of the protective coating near the edges of the area to be protected. Other techniques attempt to screen print liquid polyimide in a pattern on the semiconductor wafer itself. However, such techniques have been hampered by the inability to print polyimide in sufficient thicknesses. Generally, in addition to their high failure rate, steps of dispensing and applying liquid or paste are difficult to automate.

Accordingly, it is a general object of this invention to provide an improved method for providing a semiconductor structure with alpha particle resistance and to provide such semiconductor structures.

Another object of the present invention is to provide such a method and structure which reduces the problems involved in the use of paste or liquid alpha particle resistant materials.

Another object of this invention is to provide such a method which can be automated.

SUMMARY OF THE INVENTION

In one form of the invention, a method is provided for making a semiconductor structure. The method includes the step of providing a semiconductor wafer including a plurality of integrated circuits therein. The wafer has a pair of opposing major surfaces. One of the surfaces includes a plurality of device regions which are subject to degradation by alpha particles. The method includes a step of applying an alpha particle resistant film to predetermined ones of the device regions.

BRIEF DESCRIPTION OF THE DRAWINGS

For better understanding of the invention, reference may be had to the following description, taken in conjunction with the accompanying drawings, wherein.

DETAILED DESCRIPTION OF THE INVENTION

Figure 1:
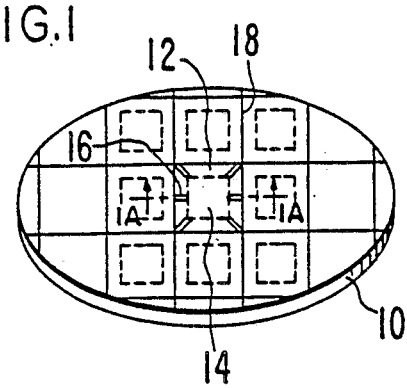
FIG. 1 is an isometric view showing an exemplary semiconductor wafer including a plurality of integrated circuits therein.
Figure 1A:
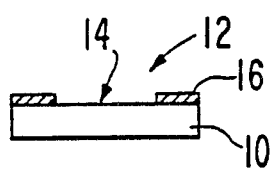
FIG. 1A is a sectional view taken along line A—A of FIG. 1.

Referring initially to FIG. 1, an exemplary semiconductor wafer 10 includes a plurality of integrated circuit devices 12, individually referred to a die. Each of the integrated circuit devices 12 includes a critical cell region 14 e.g., memory region, and a plurality of bond pads 16. As is well known, scribe lines 18 are later used in separating e.g. sawing, the wafer 10 so as to result in a plurality of individual die 12, such as shown in FIG. 1A. For purposes of clarity, although only a few exemplary integrated circuits 12 are shown in FIG. 1; a typical wafer may include as many as two thousand integrated circuits 12, each having as many as twenty four bonding pads 16 attached thereto.

As described previously, the critical cell region 14 of the integrated circuit 12 is often subject to degradation by alpha particles.

Figure 2:
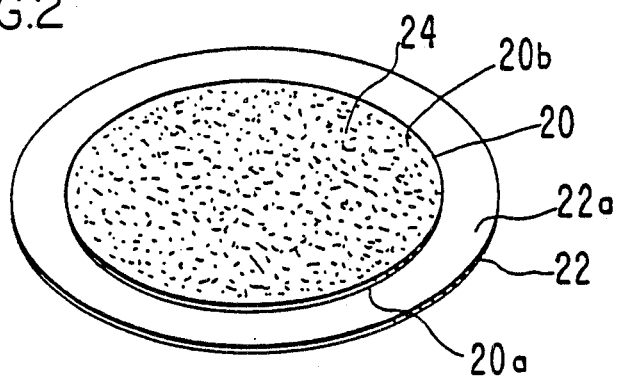
FIG. 2 is an isometric view showing one form of the present invention in which an alpha particle resistant film is disposed on a carrier film for subsequent use in the method of the present invention.

Referring now to FIG. 2, in accordance with one form of the method of the present invention, an alpha particle resistant material is provided in the form of a film 20. The alpha particle resistant film 20 is of an area at least as great as, preferably greater than, the semiconductor wafer 10. The alpha particle resistant material is selected from those well known materials which have an alpha particle resistance in the range of from greater than about 0MEV to about 10 MEV. Preferably, the alpha particle resistant material comprises a fully imidized polyimide, such as the one commercially available from Dupont under the designation Kapton. TM Typically, the thickness of the film 20 is in the range of from about 50 microns to about 100 microns, preferably about 75 microns.

For handling ease, a major surface 20a of the alpha particle resistant film 20 is shown as being removably disposed on a surface 22a of carrier film 22 which may, for example, comprise a material such as polyoelefin. The remaining major surface 20b of the alpha particle resistant film 20 is subsequently used to contact the critical cell regions 14 in a manner to be described later. This remaining surface 20b is preferably coated with a thermal cure adhesive 24, resulting in the structure shown in FIG. 2. An exemplary thermal cure adhesive 24 comprises acrylic adhesive, commercially available under the designation Rogers 10,000 from Rogers Corp.

Figure 3:
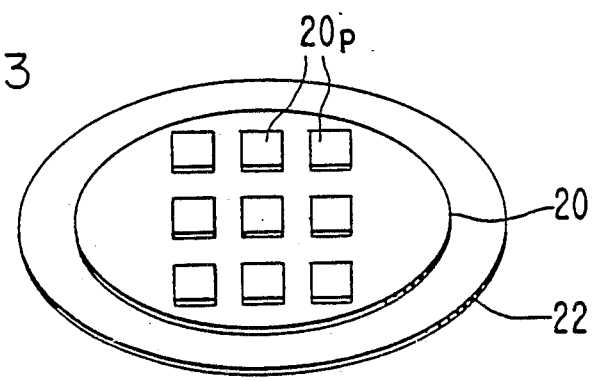
FIG. 3 is an isometric view, taken as in FIG. 2, showing the alpha particle resistant film after it has been patterned in accordance with one form of the method of the present invention.

Next, as shown in FIG. 3, an appropriate pattern corresponding to the pattern of critical cell regions 14 in FIG. 1, is provided in the alpha particle resistant film 20. This results in a plurality of alpha particle resistant film portions 20p, each of which respectively correspond to the critical cell regions 14 shown in FIG. 1.

Figure 4:
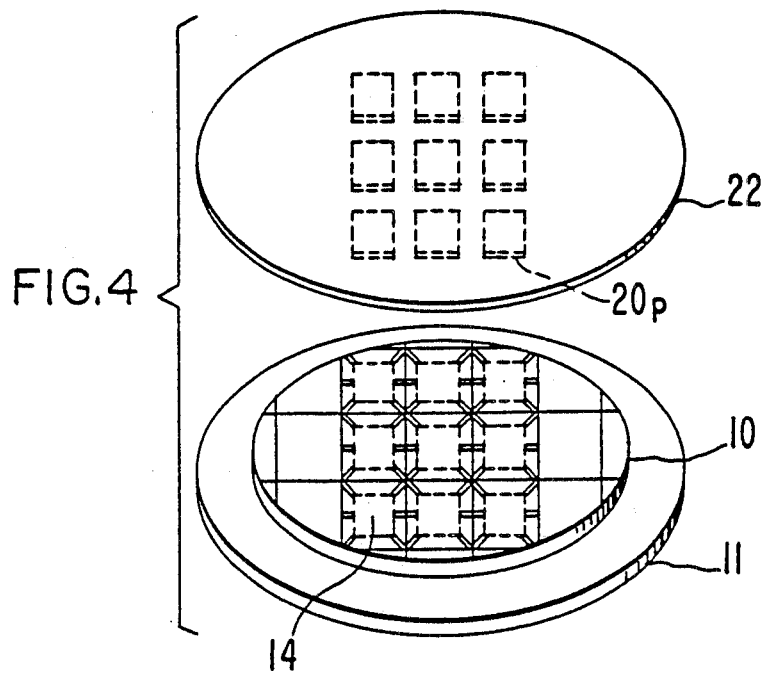
FIG. 4 is an isometric view, showing one form of the method of the present invention in which the patterned alpha particle resistant film is aligned with respective critical cell regions of the integrated circuits.

Next, as shown in FIG. 4, the now patterned alpha particle resistant film 20 (film portions 20p) is aligned with the semiconductor wafer 10 such that each of the critical cell regions 14 of the wafer 10 is respectively aligned with an alpha particle resistant film portion 20p. For handling convenience, it is preferable to employ a wafer carrier 11, which may, for example, comprise interlocking rings. The alignment is typically obtained through the use of well known techniques such as optical alignment.

When the alignment is completed, the structures shown in FIG. 4 are brought together and heat and pressure may be applied to secure the alpha particle resistant film portions 20p to the critical cell regions 14. For example, heat in the range of from about 100° C. to about 300° C. and pressure in the range of from about 1 PSI to about 30 PSI may be applied.

Figure 5:
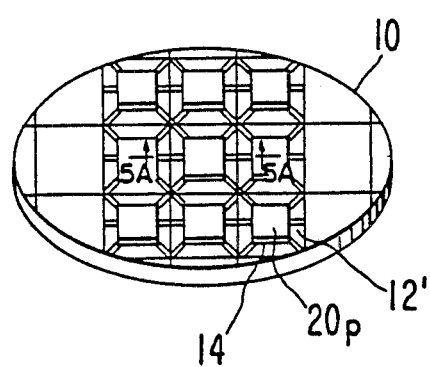
FIG. 5 is an isometric view showing one form of the semiconductor structure of the present invention after the patterned alpha particle resistant film is applied to critical cell regions of the integrated circuit.
Figure 5A:
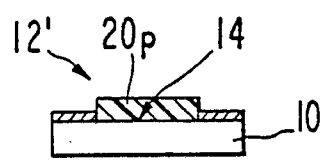
FIG. 5A is a sectional view taken along line A—A of FIG. 5 showing one form of the semiconductor device of the present invention which now includes an alpha particle resistant film portion attached to the critical cell regions thereof.

After the film portions 20p have been bonded to the critical cell regions 14, the carrier film 22 is removed, e.g., peeled off, resulting in the structure shown in FIGS. 5, 5A. At this point in the method, it is preferable to fully cure and bond the remaining film portions 20p to the critical cell regions 14. For example, such curing and bonding may include the application of heat in the range of from about 275° C. to 450° C. Thus, as shown in FIG. 5A, predetermined ones (critical cell regions 14) of the integrated circuits 12' now include an alpha particle resistant film 20p attached thereto. The individual die 12' may then be tested, identified and separated in the usual manner e.g. sawed.

Although the present invention has been described as using a polyimide material for the alpha particle resistant film 20, other materials may be substituted therefor. For example, such materials may include polyester.

In addition, although the invention has been described in connection with integrated circuit devices in which the critical cell region comprise a single central region, certain applications may present more complex critical cell region configurations and/or a plurality of separate such regions for individual integrated cell devices. In this connection, the invention is equally applicable to such configurations inasmuch as conventional techniques can be utilized to provide the desired pattern in the alpha particle resistant film prior to application of such film to the semiconductor wafer.

Further, although the present invention has been described as including a carrier film for the alpha particle resistant film in which the carrier film comprises polyoelefin, other materials may be substituted therefor. For example, one such material is poly-vinyl-chloride. However, it is preferable that the carrier film and the alpha particle resistant film have a relation therebetween wherein the alpha particle resistant film has a relative release characteristic in which it is more strongly attached to the critical cell regions and less strongly attached to the carrier film.

It is apparent that an advantage of the present invention is that custom patterning is provided for each selected integrated circuit device such that only the critical cell areas are covered. Thus, bond pads, scribe streets, etc. are not covered by the film. Another advantage of this invention is that, after the application and cure of the alpha particle resistant film portions, probe testing can still be performed. This is in contrast to conventional techniques in which bond pads are covered by an insulating material.

Another advantage of the present invention is, that in addition to providing alpha protection, the process provides protection to the device from mechanically caused damage. This is particularly important when assembly processes are employed which result in contact to the active (first) surface of the device.

While the present invention has been described with reference to specific embodiments thereof, it will be obvious to those skilled in the art that various changes and modifications may be made without departing from the invention in its broader aspects. It is contemplated in the appended claims to cover all variations and modifications of the invention which come within the true spirit and scope of our invention.

What is claimed as new and desired to be secured by Letters Patent of the United States is:

1. A method of making a semiconductor structure, comprising the steps of:
   (a) providing a semiconductor wafer including a plurality of integrated circuits therein, said wafer having a pair of opposing major surfaces, one of the surfaces including a plurality of device regions which are subject to degradation by alpha particles, and
   (b) simultaneously bonding a plurality of alpha particle resistant film portions to predetermined ones of the device regions by contacting said portions with said device regions under heat and pressure while said portions are arranged on a carrier film in a pattern corresponding to the pattern of device regions on the wafer.

2. A method in accordance with claim 1 in which the alpha particle resistant film comprises a material which has an alpha particle resistance in the range of from greater than about 0 MEV to about 10 MEV.

3. A method in accordance with claim 2 in which the alpha particle resistant film comprises polyimide.

4. A method in accordance with claim 3 in which the alpha particle resistant film has a thickness of from about 5 microns to about 100 microns.

5. A method in accordance with claim 1, wherein an adhesive is applied to the alpha resistant film prior to the step of applying the alpha resistant film to the predetermined ones of the device regions.

6. A method in accordance with claim 5 in which the alpha resistant film has a relative release characteristic wherein it is more strongly attached to the predetermined ones of the device regions and less strongly attached to the carrier film.

7. A method in accordance with claim 1 in which the carrier film comprises polyoelefin.

8. A method in accordance with claim 1 in which the carrier film comprises poly-vinyl-chloride.

9. A method in accordance with claim 1 which includes the step of probe testing at least some of the plurality of integrated circuits after step (b) is performed.

10. A method in accordance with claim 9 which includes the step of separating individual ones of the integrated circuits after the step of probe testing.

* * * * *